(12) United States Patent
Hokari

(10) Patent No.: US 6,285,400 B1
(45) Date of Patent: Sep. 4, 2001

(54) SOLID STATE IMAGE PICK-UP DEVICE EQUIPPED WITH CHARGE COUPLED DEVICE HAVING INCIDENT SURFACE ALIGNABLE WITH FOCAL PLANE

(75) Inventor: Yasuaki Hokari, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/937,888

(22) Filed: Sep. 25, 1997

(30) Foreign Application Priority Data

Sep. 26, 1996 (JP) .................................................... 8-254435

(51) Int. Cl.[7] ........................ H04N 5/335; H04N 5/225; H04N 1/04; H01J 5/02
(52) U.S. Cl. ........................ 348/374; 348/294; 358/493; 250/239
(58) Field of Search ..................................... 348/340, 374, 348/373, 375, 376, 294; 359/846, 847, 848, 849; 250/239, 208, 1; 358/482, 493

(56) References Cited

U.S. PATENT DOCUMENTS

| | | | |
|---|---|---|---|
| 3,839,632 | * 10/1974 | Federico .............................. | 359/846 |
| 4,059,346 | * 11/1977 | Levine et al. ...................... | 359/847 |
| 4,467,361 | * 8/1984 | Ohno et al. ......................... | 348/340 |
| 4,725,890 | * 2/1988 | Yaniv et al. ......................... | 358/493 |
| 5,498,868 | * 3/1996 | Nishikawa et al. ................. | 359/846 |
| 5,862,003 | * 2/1999 | Saif et al. ............................ | 359/846 |

FOREIGN PATENT DOCUMENTS

| | | | |
|---|---|---|---|
| 480616A2 | * 4/1992 | (EP) | ................................. G03F/7/20 |
| 62-061489 | * 3/1987 | (JP) | ................................. H04N/9/07 |
| 1-202989 | 8/1989 | (JP) | ................................. H04N/5/335 |
| 01-264219 | * 10/1989 | (JP) | ................................. H01L/21/30 |

OTHER PUBLICATIONS

"Digital System for Information Media and High–Resolution Oriented Commercial Use", Digital Camera Index, 42–43, 46–47 (1996).

* cited by examiner

Primary Examiner—Wendy R. Garber
Assistant Examiner—Andrew B. Christensen
(74) Attorney, Agent, or Firm—Foley & Lardner

(57) ABSTRACT

A solid state image pick-up device has a rigid retainer having a hollow space, a resilient plate member closing the hollow space, a charge coupled device integrated on a semiconductor chip mounted on the resilient plate member, an optical lens focusing an image on a photo-electric converting region of the charge coupled device and an actuator connected between the bottom surface of the retainer and the resilient plate member so as to deform the resilient plate member and the semiconductor chip, thereby adjusting the surface of the semiconductor chip to a focal plane.

14 Claims, 13 Drawing Sheets

SOLID STATE IMAGE PICK-UP DEVICE EQUIPPED WITH CHARGE COUPLED DEVICE HAVING INCIDENT SURFACE ALIGNABLE WITH FOCAL PLANE

FIELD OF THE INVENTION

This invention relates to a solid state image pick-up device and, more particularly, to a solid state image pick-up device equipped with a charge-coupled device having an incident surface alignable with a focal plane.

DESCRIPTION OF THE RELATED ART

A personal computer processes digital video signals, and a digital video recorder is required as a source of the digital video signal representative of an image. An electronic still camera and a digital movie camera are typical examples of the source of digital video signal presently obtainable in the market. The digital video recorder is equipped with a charge-coupled device, and an image is picked up through the charge-coupled device.

FIG. 1 illustrates a typical example of the charge-coupled device incorporated in the prior art digital video recorder. The prior art charge coupled device comprises an array 1 of photo-diodes 1a, and the photo-diodes 1a converts a photo-radiation carrying an image to electric charge. The amount of electric charge is proportional to the intensity of the photo-radiation. A plurality of vertical shift registers 2 are associated with the columns of photodiodes 1a, and transfer transistors 3 are connected between the photo-diodes 1a and the vertical shift registers 2. The transfer transistors 3 concurrently turn on, and the electric charge is provided from the array 1 to the vertical shift registers 2 as charge packets. The charge packets are representative of the image. Though not shown in FIG. 1, each of the vertical shift registers 2 has charge transfer electrodes and transfers the charge packets in synchronism with a multi-phase charge transfer signal applied to the charge transfer electrodes.

The prior art charge coupled device further comprises a horizontal shift register 4 and an output circuit 5 connected to the horizontal shift register 4. The vertical shift registers 2 are connected to the horizontal shift register 4, and the charge packets read out from each row of photo-diodes 1a are transferred from the vertical shift registers 2 to the horizontal shift register 4. The horizontal shift register 4 also has charge transfer electrodes (not shown), and conveys the charge packets to the output circuit 5 in synchronism with a multi-phase charge transfer signal. The output signal 5 converts the charge packets to a potential signal IMG carrying the image.

The prior art charge coupled device behaves as follows. Assuming now that image-carrying light is incident onto the array 1 of photo-diodes 1a, the photo-diodes 1a produce electric charge depending upon the intensity of the image-carrying light, and accumulate the electric charge for a sixtieth second. Thereafter, a read-out signal is applied to the gate electrodes of the transfer transistors 3, and the transfer transistors 3 concurrently turn on. Then, the array 1 supplies the charge packets to the vertical shift registers 2. The multi-phase charge transfer signal is sequentially supplied to the vertical shift registers 2, and the vertical shift registers 2 convey the charge packets to the horizontal shift register 4. The vertical shift registers 2 firstly deliver the charge packets read out from the row of photo-diodes 1 a closest to the horizontal shift register 4, and the charge packets are corresponding to pixels on a horizontal scanning line. The horizontal shift register 4 successively supplies the charge packets to the output circuit 5 during a horizontal scanning period, and the charge packets read out from the next row are delivered from the vertical shift registers 2 to the horizontal shift register 4 at the end of the horizontal scanning period. In this way, the charge packets are sequentially supplied from the vertical shift registers 2 through the horizontal shift register 4 to the output circuit 5, and the output circuit 5 converts the charge packets to the potential signal IMG representative of the image.

The image-carrying light is incident onto the array of photo-diodes 1a through micro-lens 6 as shown in FIG. 2. Firstly, description is made on the structure of the prior art charge-coupled device. The prior art charge coupled device is fabricated on an n-type semiconductor substrate 10. A p-type well 11 is defined in a surface portion of the n-type semiconductor substrate 10. Heavily doped n-type accumulating regions 12 are arrayed in the p-type well 11, and are overlapped with heavily doped p-type regions 13. The p-n junctions between the heavily doped p-type regions 13 and the heavily doped n-type accumulating regions 12 form the photo-diodes 1a.

Heavily doped n-type channel regions 13 are further formed in the p-type well 11, and are alternated with the columns of heavily doped n-type accumulating regions 12. Heavily doped p-type channel stopper regions 14 isolate the heavily doped n-type channel regions 13 from the non-associated columns of heavily doped n-type accumulating regions 12. A thin insulating layer 16 covers the surface of the p-type well 11, and the charge transfer electrodes 17 of polycrystalline silicon are formed on the thin insulating layer 16. The heavily doped n-type channel regions 13, the thin insulating layer 16 and the charge transfer electrodes 17 as a whole constitute the vertical shift registers 2.

The charge transfer electrodes 17 are covered with inter-level insulating layers 18, and a photo-shield layer 19 is formed on the inter-level insulating layers 18. The photo-shield layer 19 prevents the heavily doped n-type channel regions 14 from photo radiation, and allows the image-carrying light LT to fall onto the photo-diodes 1a. The photo-shield layers 19 are covered with an insulating layer 20. Though not shown in FIG. 2, the horizontal shift register 4 and the output circuit 5 are further fabricated on the n-type semiconductor substrate 10.

The insulating layer 20 is covered with a thick transparent resin layer 21, and the micro-lenses 6 are formed on the top surface of the thick transparent resin layer 21. The micro-lenses concentrate the image-carrying light LT onto the photo-diodes 1a, and the image-carrying light LT is incident through the thick transparent resin layer 21 and the apertures 19a formed in the photo-shield layer 19 onto the photo-diodes 1a. For this reason, the micro-lenses 6 are located over the apertures 19a. The thick transparent resin layer 21 provides the flat surface for the micro-lenses 6, and regulates the distance between the micro-lenses 6 and the photo-diodes 1a to the focal length of the micro-lenses 6.

The digital video recorder is a consumer good, and is expected to reduce the price in the market. For this reason, a small semiconductor chip is used for the prior art charge coupled device. In fact, although the prior art charge coupled device for a quarter inch optical format contains two hundred fifty thousand to three hundred eighty thousand pixels, it fabricated on a semiconductor chip of 4 millimeters by 4.5 millimeters.

On the other hand, the resolution is the most important factor in a printing business, and the prior art charge coupled device contains one million to several million pixels. The minimum pixel occupies an area of 5 microns by 5 microns, and the prior art charge coupled device requires a large semiconductor chip. For example, the video camera DCB-II is manufactured by Ni-hon Scitex ltd., and a charge-coupled device incorporated therein has four million and two hundred thousand pixels fabricated on a semiconductor chip of 30 millimeters by 30 millimeters. Another high-resolution video camera is manufactured by Kodak Japan Corporation as "DCS420", and has six million pixels fabricated on a semiconductor chip of 18.4 millimeters by 27.6 millimeters.

FIG. 3 illustrates the structure of an example 30 of the prior art video recorder. A semiconductor chip 31 is mounted on an inner flat surface of a package 32, and the charge-coupled device is integrated on the semiconductor chip 31. An optical lens 33 is provided in front of the semiconductor chip 31, and an optical axis passing through the center of the lens 33 is perpendicular to the inner flat surface.

When the optical lens 33 is directed to an object 34, the object 33 forms an image 35 on the photo-electric converter of the semiconductor chip 31. However, the optical lens 33 is causative of various aberrations. Especially, the image 35 is warped in the peripheral area of the photo-electric converter due to the image surface distortion. For this reason, the image 35 is only focused on the central area of the photo-electric converter, and is formed on the focal plane only matched with the photo-electric converter in the central area. In other words, although the central area achieves a high resolution, the resolution in the peripheral area is not so high as the central area, and the optical lens 33 deteriorates the image 35. For example, when one hundred and fifty lines per millimeter are discriminated in the central area, the resolution in the peripheral area is reduced to less than one hundred lines per millimeter. However, if the photo-electric converter is moved along the optical axis by ±0.3 millimeter, the resolution in the peripheral area is improved to 120 to 130 lines per millimeter.

In this situation, if the semiconductor chip 31 is enlarged, it is necessary to elongate the focal length in order to keep the field angle. Even if the value of the stop or F value is maintained, the depth of field becomes shallow, and the image surface distortion is made serious. If the digital video recorder records a color image, the chromatic aberration must be taken into account, and the periphery of the image 35 is different in color from the periphery of the object 34. Moreover, an optical ray RI (see FIG. 2) is obliquely incident on the micro-lens 6, and is reflected on the photo-shield layer 19, and is partially incident onto the photo-diode 1a.

Japanese Patent Publication of Unexamined Application No. 1-202989 teaches a solution. FIG. 4 illustrates the video recorder disclosed in the Japanese Patent Publication of Unexamined Application. The video recorder shown in FIG. 4 is different in the inner surface from the video recorder shown in FIG. 3. In detail, the semiconductor chip 31 is bonded to a curved inner surface 36a of a package 36, and the photo-electric converter on the semiconductor chip 31 is also warped along the curved inner surface 36a. The image surface distortion is taken up by the photo-electric converter curved along the curved inner surface 36a, and the lens 33 forms the image 35 along the curved surface of the photo-electric converter. However, the magnitude of the image surface distortion is different between lenses. Even though the curved inner surface 36a is appropriate for the optical lens 33, the curved inner surface 36a is not always appropriate for an optical lens different in the image surface distortion.

SUMMARY OF THE INVENTION

It is therefore an important object of the present invention to provide a solid state image pick-up device which exactly forms an image on a surface of a photo-electric converter regardless of the image surface distortion of a lens incorporated therein.

To accomplish the object, the present invention proposes to deform a semiconductor chip along an image surface.

In accordance with one aspect of the present invention, there is provided a solid state image pick-up device comprising a retainer having a hollow space open to one end thereof, a resilient plate member provided in the hollow space, a semiconductor chip having an integrated circuit containing a charge coupled device and fixed to the resilient plate member so as to be conformable to the resilient plate member, a lens spaced from the semiconductor chip so as to focus an optical image onto a portion of the semiconductor chip where the charge coupled device is fabricated, and an actuator connected between the retainer and the resilient plate member so as to deform the resilient plate member.

BRIEF DESCRIPTION OF THE DRAWINGS

The features and advantages of the solid state image pick-up device will be more clearly understood from the following description taken in conjunction with the accompanying drawings in which.

DESCRIPTION OF THE PREFERRED EMBODIMENTS

First Embodiment

Figure 1:
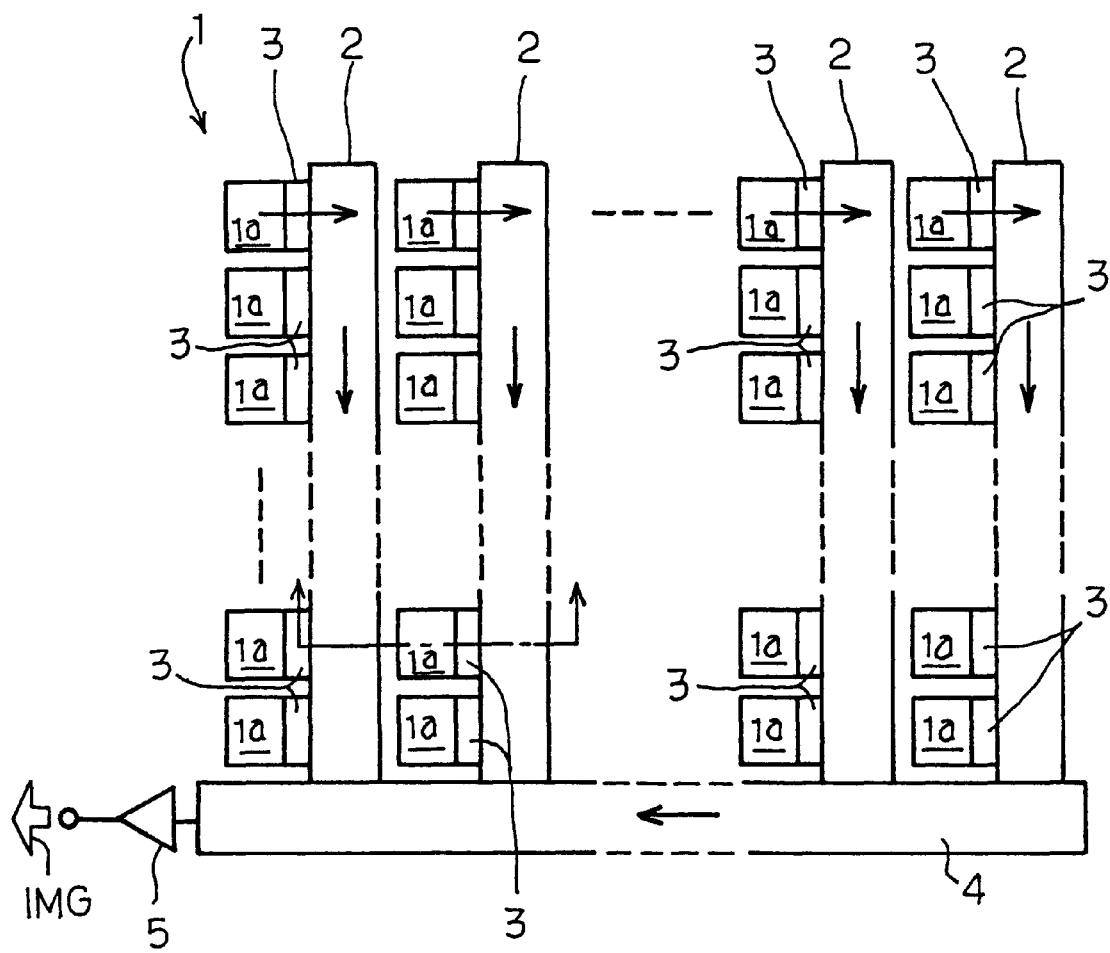
FIG. 1 is a plan view showing the arrangement of the prior art charge coupled device.
Figure 2:
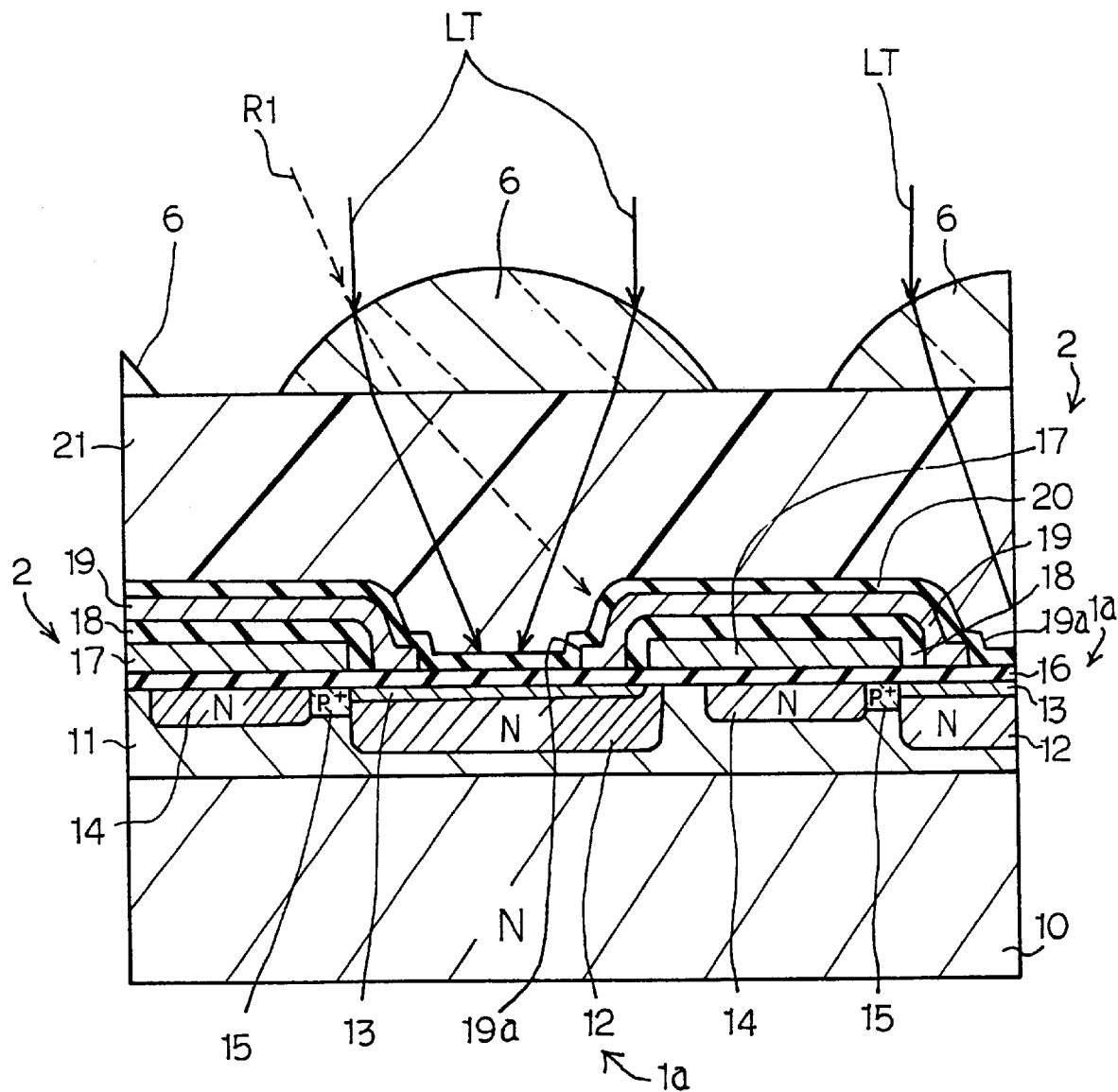
FIG. 2 is a cross sectional view taken along line A—A of FIG. 1 and showing the structure of the prior art charge coupled device accompanied with the micro-lens.
Figure 3:
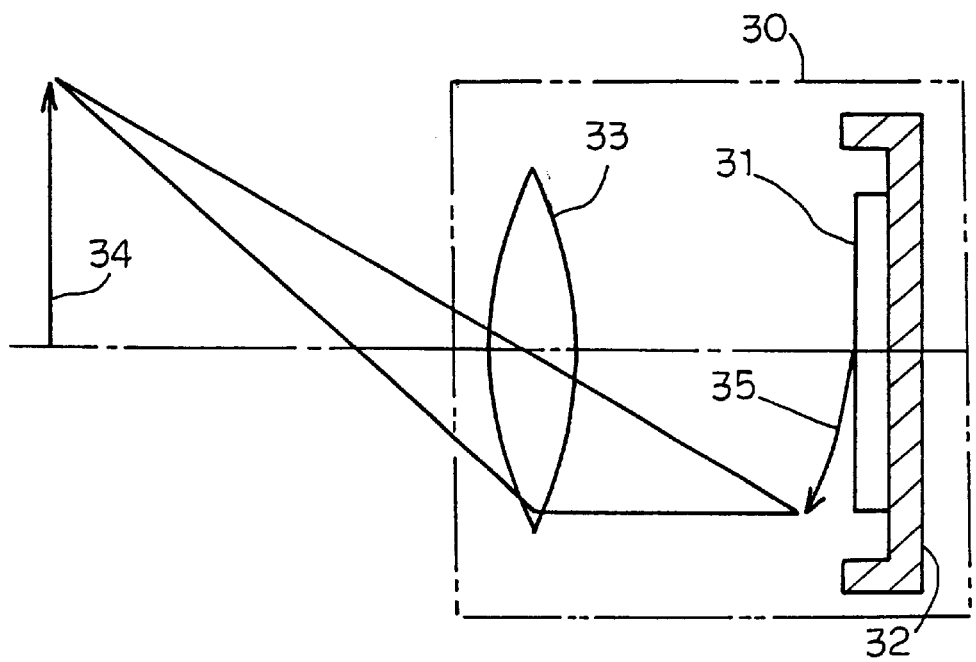
FIG. 3 is a schematic view showing the structure of the prior art video recorder.
Figure 4:
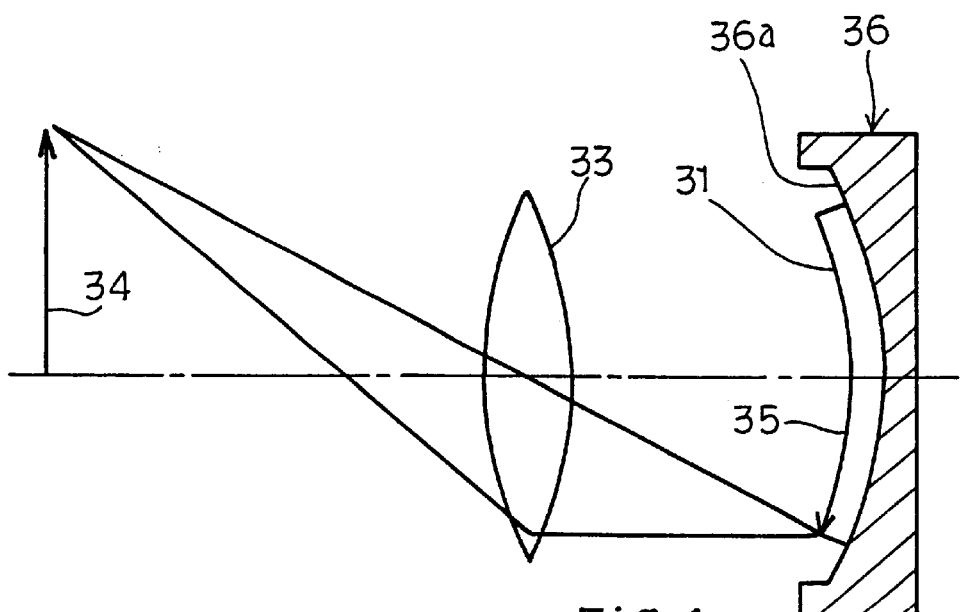
FIG. 4 is a schematic view showing the structure of the prior art video recorder disclosed in Japanese Patent Publication of Unexamined Application No. 1-202989.
Figure 5:
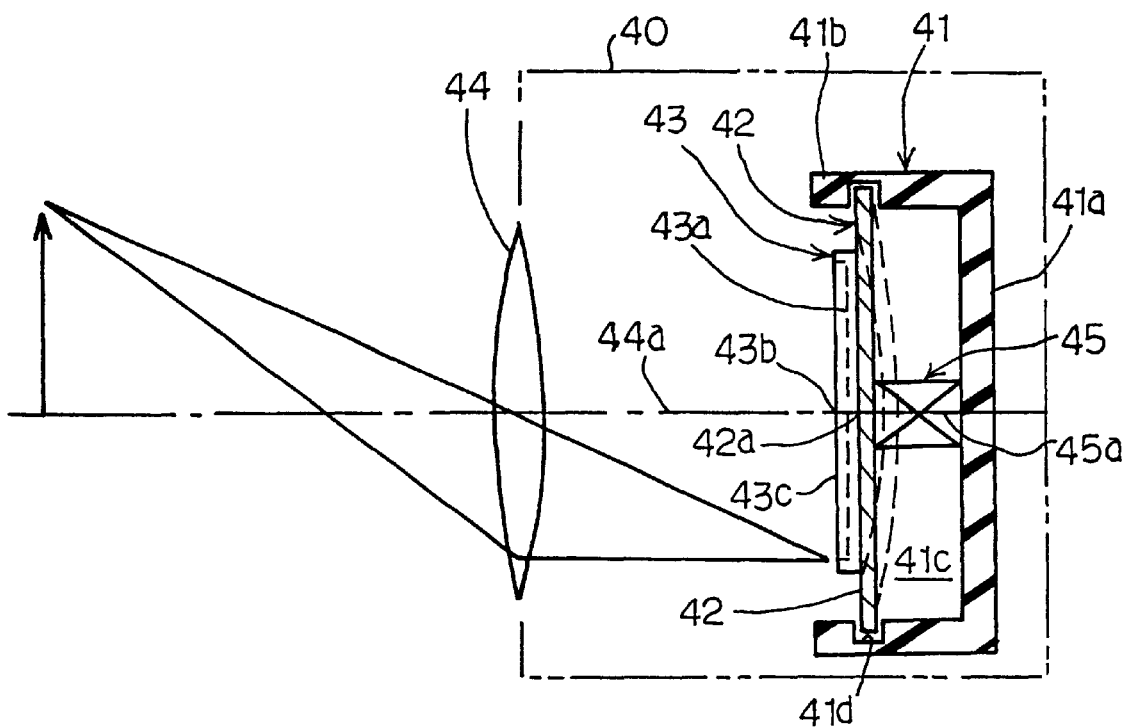
FIG. 5 is a schematic cross sectional view showing the structure of a video recorder according to the present invention.
Figure 6:
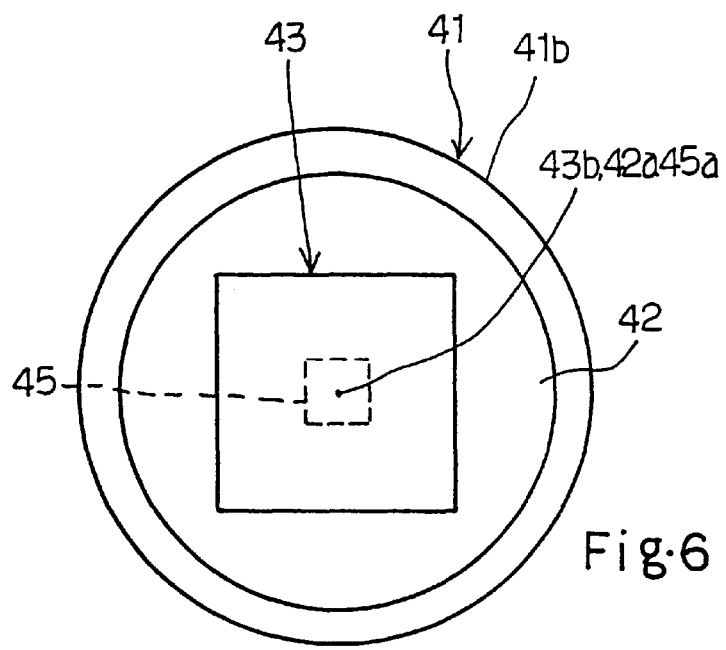
FIG. 6 is a front view showing the arrangement of a semiconductor chip and an actuator with respect to a resilient plate member.

Referring to FIG. 5 of the drawings, a solid state image pick-up device or a video recorder 40 embodying the present invention comprises a rigid retainer 41 and a resilient plate member 42. The rigid retainer 41 has a circular bottom plate 41a and a cylindrical side wall 41b, and the circular bottom plate 41a and the cylindrical side wall 41b define a recess 41c. A groove 41d is formed in the cylindrical side wall 41b, and the periphery of the resilient plate member 42 is inserted into the groove 41d. Thus, the resilient plate member 42 is supported by the cylindrical side wall 41b, and is spaced from the circular bottom plate 41a. The resilient plate member 42 is, by way of example, formed of beryllium copper alloy or martensitic stainless steel, and ranges between 50 microns to 200 microns in thickness. For this reason, the resilient plate member 42 is deformable as indicated by broken lines. A conductive pattern may be printed on a surface 42b of the resilient plate member 42. The video recorder 40 further comprises a semiconductor chip 43 mounted on the resilient plate member 42 and an optical lens 44. The charge coupled device shown in FIG. 1 is integrated in a surface portion 43a of the semiconductor chip, and the output circuit 5 is connected to an analog-to-digital converter (not shown). The analog-to-digital converter converts the potential signal IMG to digital codes, and the digital codes are stored in a video memory (not shown). The digital codes are representative of an image, and are read out from the video memory to an output port connectable to a personal computer, by way of example.

The video recorder may further comprise a video controller (not shown) and a liquid crystal display. The video controller is connected to the video memory, and produces the image fallen onto the charge coupled device on the liquid crystal display. If the conductive pattern is printed on the surface 42b, the charge coupled device is connected to the conductive pattern, and communicates with the other component chips through the conductive pattern.

The semiconductor chip 43 has a center 43a or a crossing point between diagonal lines, and the center 43a is substantially coincident with the center 42a of the resilient plate member 42. The semiconductor chip 41 has a reverse surface bonded to the resilient plate member 43 by means of silver alloy paste or epoxy resin. The semiconductor chip 43 ranges 200 microns to 300 microns in thickness, and is conformable to the resilient plate member 42. The optical lens 44 is provided in front of the semiconductor chip 43, and has an optical axis 44a passing through the center 43b of the semiconductor chip 43 and the center 42a of the resilient plate member 42. The optical axis 44a is perpendicular to the semiconductor chip 43 in so far as the resilient plate member 42 is not deformed.

Figure 7:
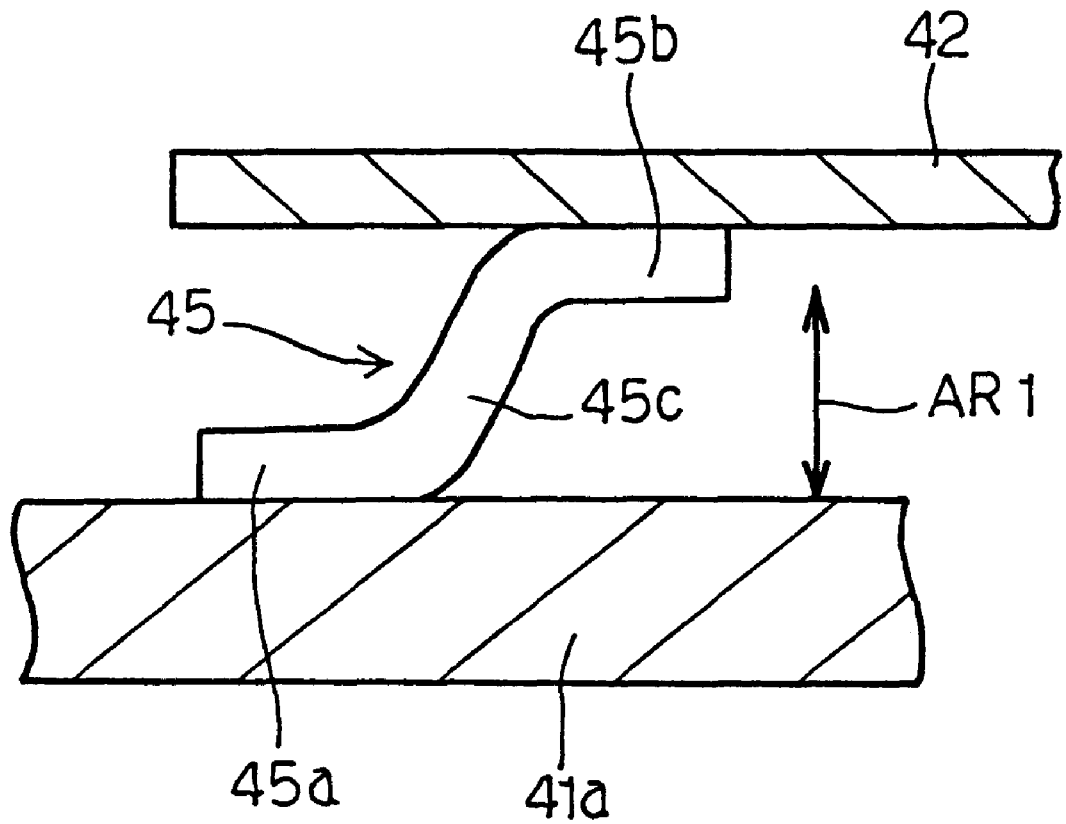
FIG. 7 is a side view showing a bimorph cell.

The video recorder 40 further comprises an actuator 45 connected between the circular bottom plate 41a and the resilient plate member 42. The actuator 45 is, by way of example, implemented by an electrostrictive element such as, for example, a bimorph cell. The bimorph cell is illustrated in FIG. 7, and has one end portion 45a fixed to the circular bottom plate 41a, the other end portion 45b fixed to the resilient plate member 42 and a curved portion 45c between these end portions 45a and 45b. Though not shown in FIG. 7, the bimorph cell further has electrodes, and electric potential is applied to the electrodes through an electrode provided on the circular bottom plate 41a or the resilient plate member 42. Then, the bimorph cell is expanded or shrunk in the direction indicated by arrow AR1. When the actuator 45 pulls the resilient plate member 42, the resilient plate member 42 becomes concave, and curves the surface 42b toward the circular bottom plate 41a. On the other hand, when the actuator 45 pushes the resilient plate member 42, the resilient plate member 42 becomes convex, and projects the surface 42b toward the optical lens 44.

The actuator 45 is placed in a center area of the circular bottom plate 41a, and has a center line 45a substantially aligned with the optical axis 44a. When the actuator deforms the resilient plate member 42 and, accordingly, the semiconductor chip 43, the surface 43c of the semiconductor chip 43 is curved with a constant radius of curvature, and the center of the radius of curvature is on the optical axis 44a.

The optical lens 44 available for the video recorder 40 has the image surface distortion of the order of 0.3 millimeter to 0.5 millimeter, and, accordingly, the actuator 45 is adopted to have the displacement ranging from ±0.5 millimeter to ±1.0 millimeter in the direction of the optical axis 44a. Thus, the actuator 45 can align the surface 43c with an image surface formed by the optical lens 44.

Figure 8:
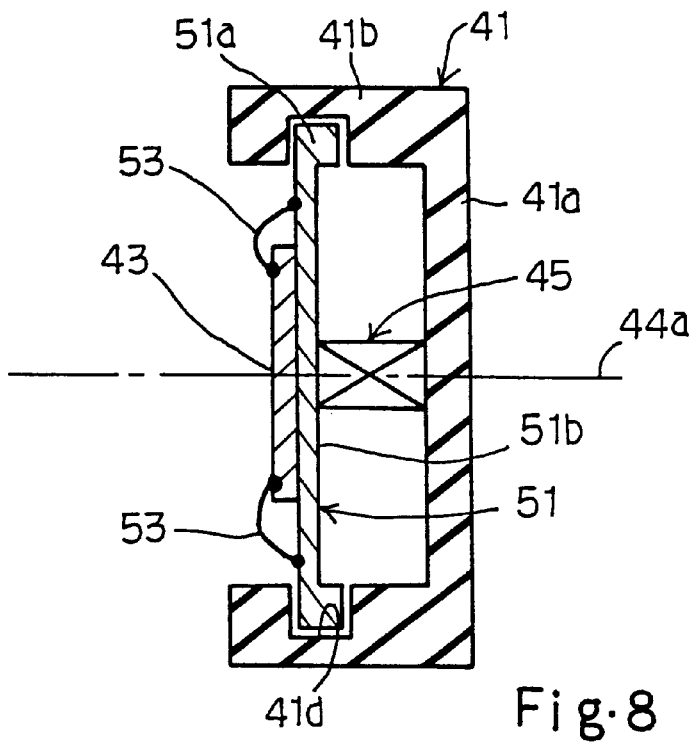
FIG. 8 is a schematic cross sectional view showing a first modification of a resilient plate member.

The resilient plate member 42 may be replaced with a resilient plate member 51 shown in FIG. 8. The resilient plate member 51 has a thick rim portion 51a and a thin disk portion 51b, and the thick rim portion 51 is inserted into the groove 41 d. The thick rim portion 51a causes the thin disk portion 51b to be deformed in such a manner as to form cocentrical circles different in the displacement in the direction of the optical axis 44a.

Figure 9:
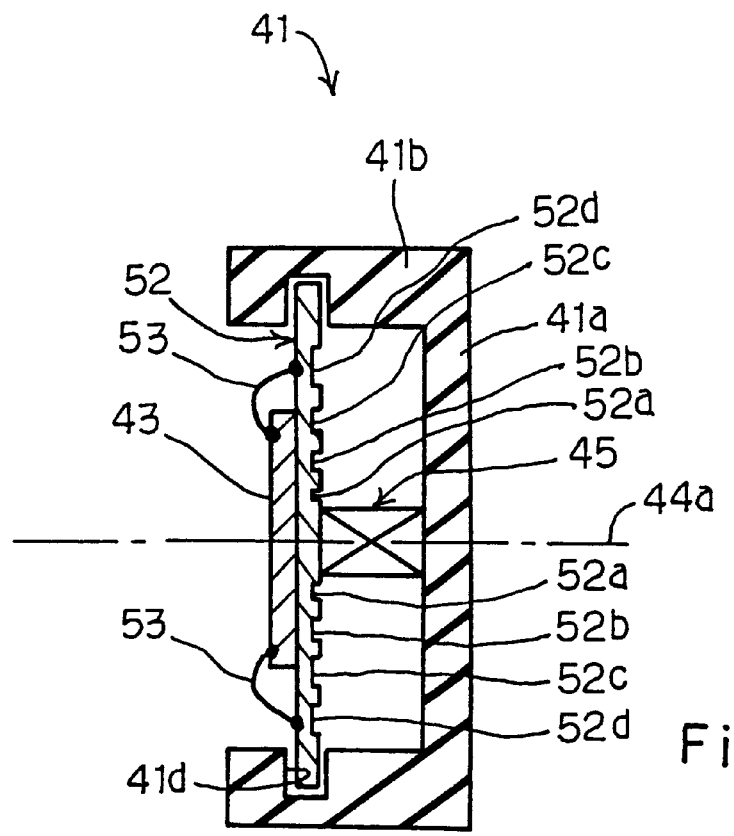
FIG. 9 is a schematic cross sectional view showing a second modification of the resilient plate member.

FIG. 9 illustrates another resilient plate member 52 available for the video recorder 40. Cocentrical grooves 52a, 52b, 52c and 52d are formed in the resilient plate member 52, and the width is decreased from the groove 52d toward the groove 52a. The cocentrical grooves 52a to 52d causes the resilient plate member 52 to be cocentrically deformed.

If the resilient plate member 51 or 52 is implemented by a printed circuit board, the charge-coupled device is connected through conductive wires 53 to a conductive pattern on the resilient plate member 51 or 52.

Figure 10:
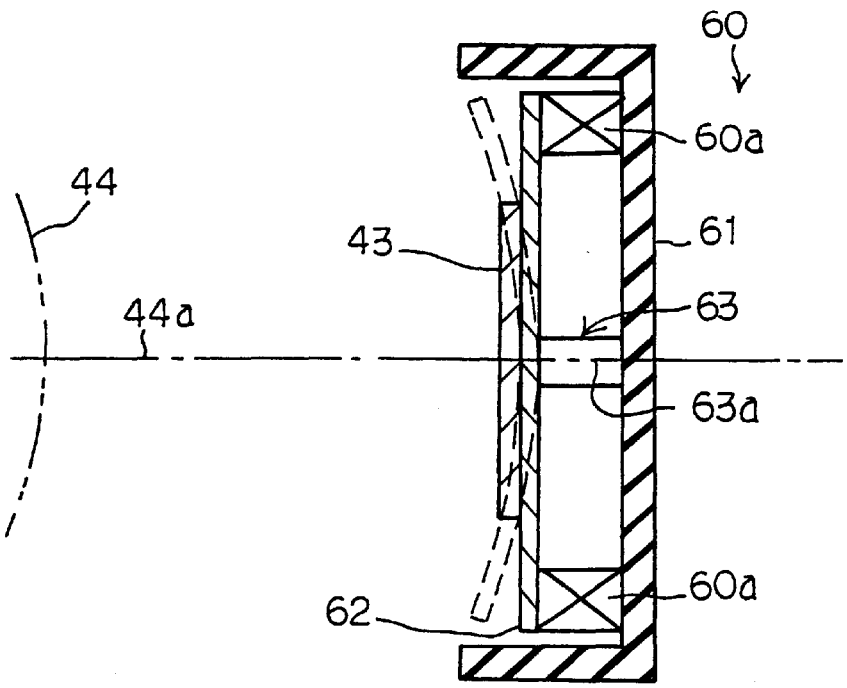
FIG. 10 is a schematic cross sectional view showing an actuator incorporated in another video recorder.
Figure 11:
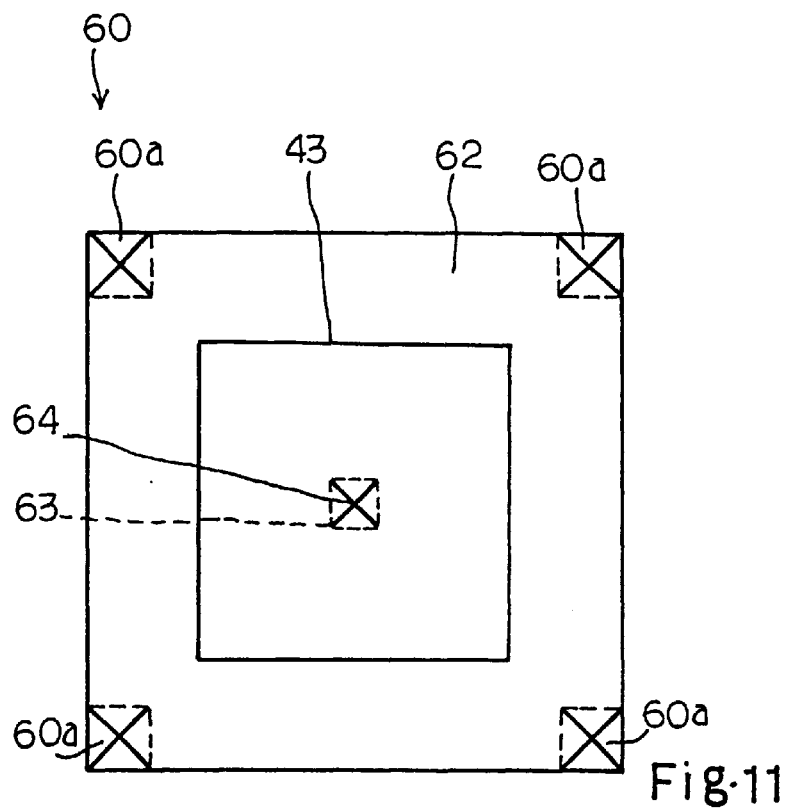
FIG. 11 is a front view showing the arrangement of a semiconductor chip and a resilient plate member with respect to the actuator.

FIGS. 10 and 11 illustrate an actuator 60 incorporated in another video recorder embodying the present invention. The actuator 60 is implemented by four actuator elements 60a, and the actuator elements 60a are connected between a retainer 61 and the four corners of a rectangular resilient plate member 62. The actuator element 60a may be the bimorph cell. The semiconductor chip 43 is bonded to the rectangular resilient plate member 62, and a rigid post member 63 is further provided between the retainer 61 and the rectangular resilient plate member 62. In this instance, the resilient plate member 62 is shaped into a rectangular configuration. However, a circular resilient plate member is available.

The rectangular resilient plate member has diagonal lines crossing each other at point 64, and the diagonal lines of the semiconductor chip 43 also pass through the point 64. The rigid post member 63 has a center line 63a aligned with the optical axis 44a, and the point 64 is also provided on the optical axis 44a.

When the actuator elements 60a are expanded or shrunk, the actuator elements 60a push or pull the four corners of the rectangular resilient plate member 62, and the rectangular resilient plate member 62 is deformed to be concave as indicated by broken lines in FIG. 10 or convex. If the bimorph cell is used as the actuator element 60a, the actuator elements 60a can achieve the displacement of the rectangular resilient plate member 62 by ±0.5 millimeter. However, the central area of the rectangular resilient plate member 62 is bonded to the rigid post member 63, and is stable with respect to the optical lens 44. For this reason, it is unnecessary for the video decoder to readjust the focal length.

Figure 12:
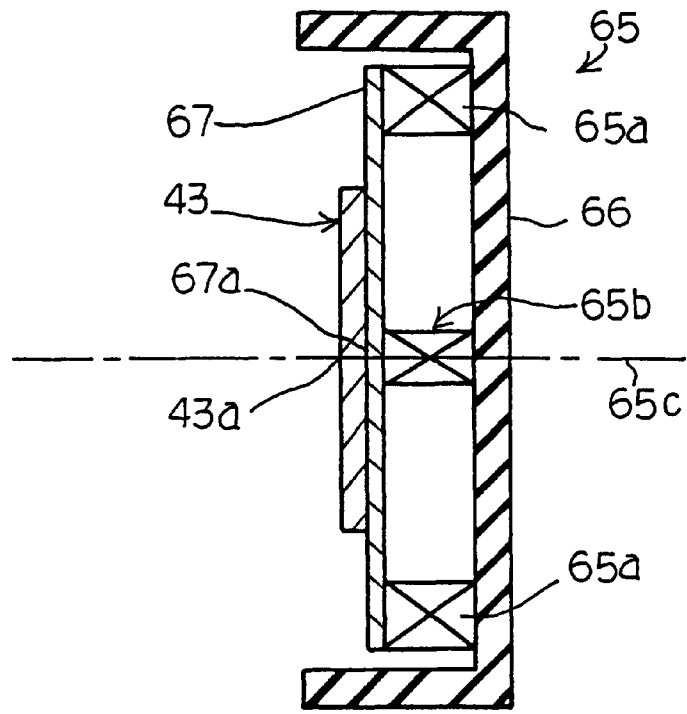
FIG. 12 is a schematic cross sectional view showing an actuator incorporated in yet another video recorder.
Figure 13:
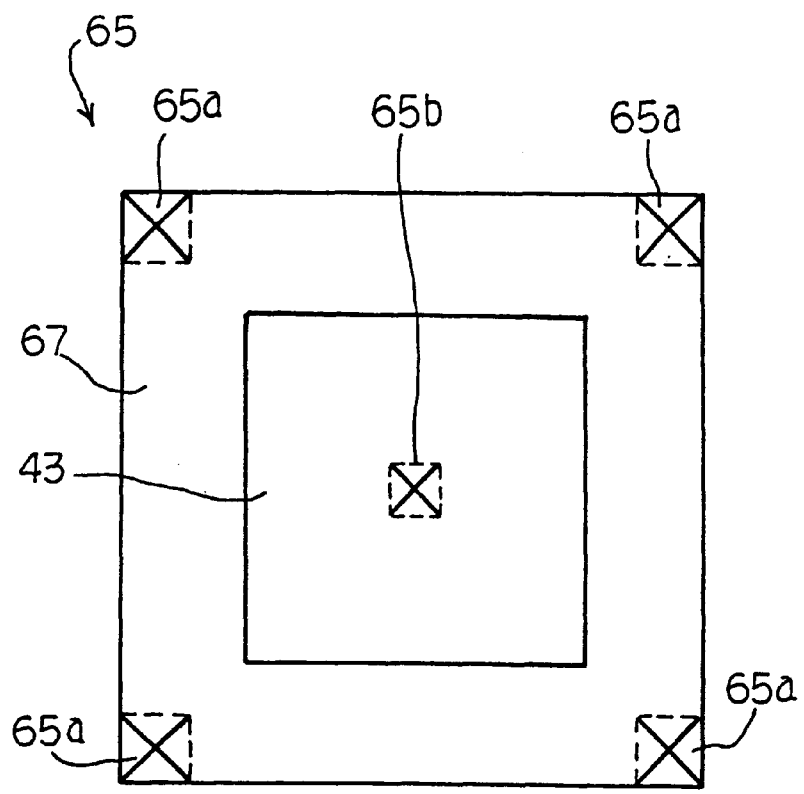
FIG. 13 is a front view showing a semiconductor chip and a resilient plate member with respect to the actuator.

FIGS. 12 and 13 illustrate another actuator 65 incorporated in yet another video recorder. The actuator 65 is implemented by actuator elements 65a/65b. The actuator elements 65a are connected between a retainer 66 and the four corners of a rectangular resilient plate member 66, and the actuator element 65b is connected between the retainer 66 and a center 67a or a crossing point between the diagonal lines of the rectangular resilient plate member 67. The semiconductor chip 43 has a center 43a or a crossing point between the diagonal lines thereof, and the center of the semiconductor chip 43 is aligned with the center 67a of the rectangular resilient plate member 67. The actuator element 65b has a center line 65c substantially aligned with the center 67a of the rectangular resilient plate member 67. The actuator elements 65a/65b may be implemented by the bimorph cell.

Electric potential is independently applied to the actuator elements 65a and the actuator element 65b, and the actuator elements 65a/65b deform the rectangular resilient plate member 67. If the actuator elements 65a are expanded and the actuator element 65b is shrunk, the rectangular resilient plate member 67 is widely deformed. The actuator elements 65a may be expanded by 0.3 millimeter, and the actuator element 65b may be shrunk by 0.2 millimeter. This feature is desirable, because the actuator elements 65a/65b not only warps the surface 43a but also readjusts the focal length. Thus, the actuator 65 allows the manufacturer to delete an adjusting mechanism for the focal length from the video recorder. Moreover, the actuator 65 allows user to intentionally decrease the resolution so as to vignette an image, and the user may confirm the vignette on the liquid crystal display.

Figure 14:
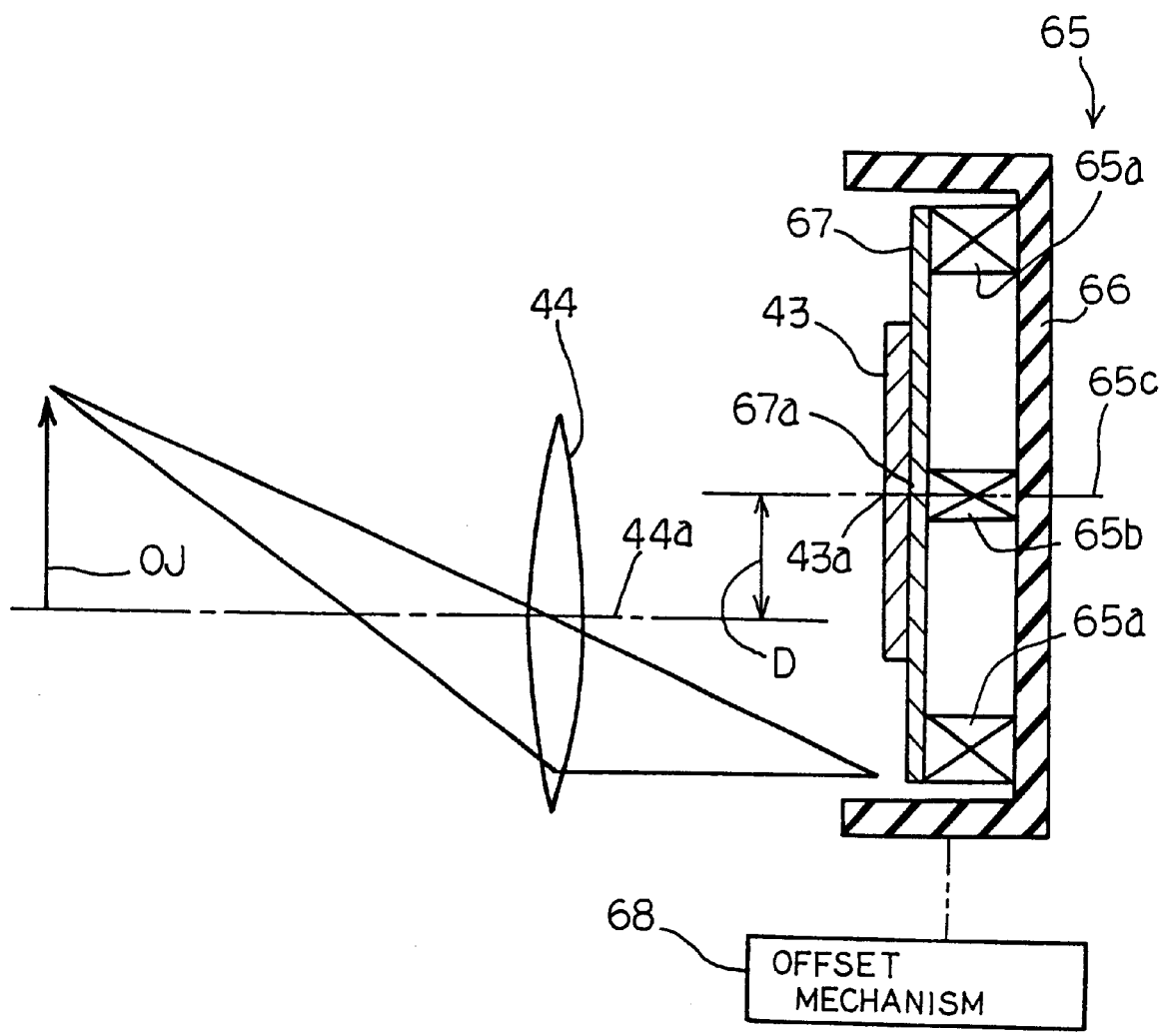
FIG. 14 is a schematic cross sectional view showing the structure of a video recorder equipped with an offset mechanism.

The center line 65c of the actuator element 65b may be offset from the optical axis 44a as shown in FIG. 14. In this instance, the video recorder is equipped with an offset mechanism 68, and the offset mechanism 68 two-dimensionally moves the retainer 66 on a virtual plane perpendicular to the optical axis 44a. When the retainer 66 is offset with respect to the optical axis 44a by distance D, the image of an object OJ is reproduced by the video recorder in such a manner that user feels depth at an angle or corrects a distortion of the image of a building.

Figure 15:
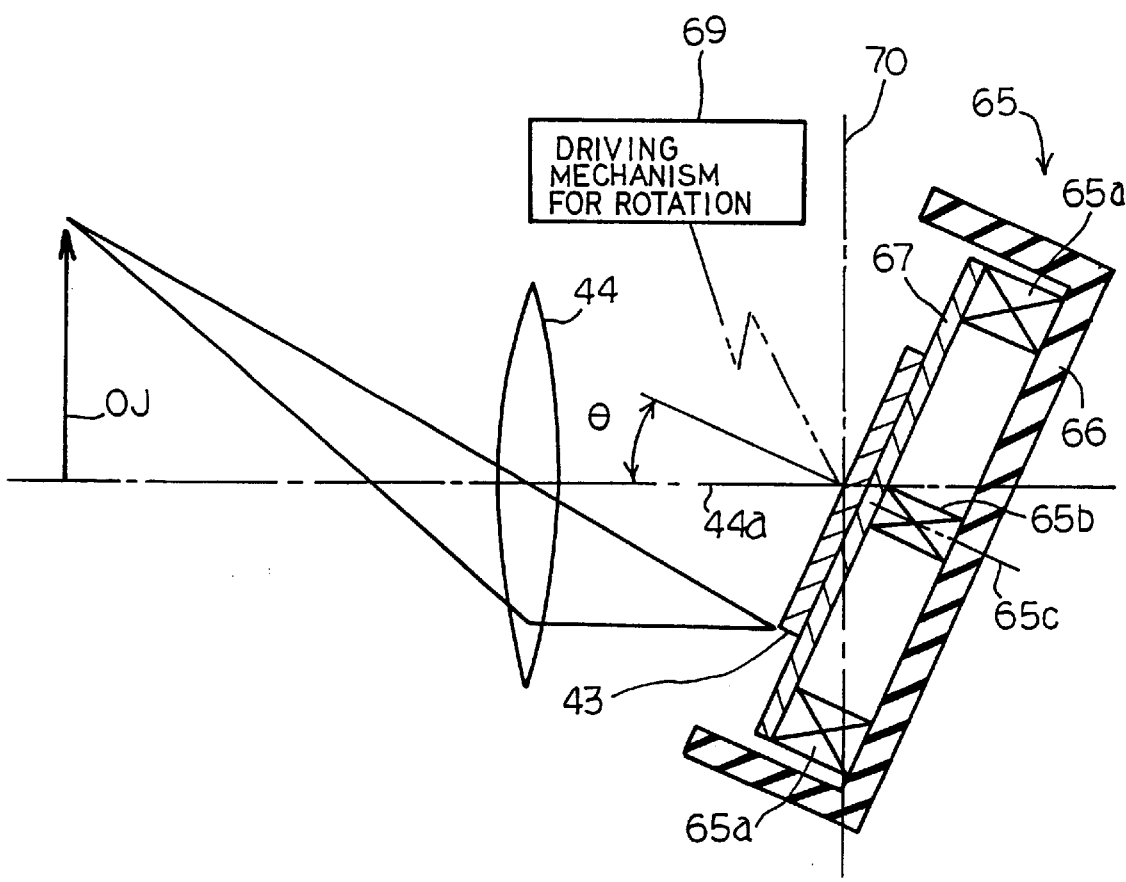
FIG. 15 is a schematic cross sectional view showing the structure of another video recorder equipped with a driving mechanism for rotation.

The retainer 66 is connected through a universal joint (not show) to a driving mechanism 69 for rotation, and the driving mechanism 69 for rotation rotates the retainer 66 so that the retainer 66 declines at θ with respect to a virtual plane 70 perpendicular to the optical axis 44a as shown in FIG. 15. The driving mechanism 69 for rotation may cause the retainer 66 to decline with respect to another virtual plane perpendicular to the optical axis. When the retainer 66 declines at θ with respect to the virtual plane 70, the image of the object OJ is reproduced by the video recorder in such a manner that user feels depth at an angle or corrects a distortion of the image of a building.

Figure 16:
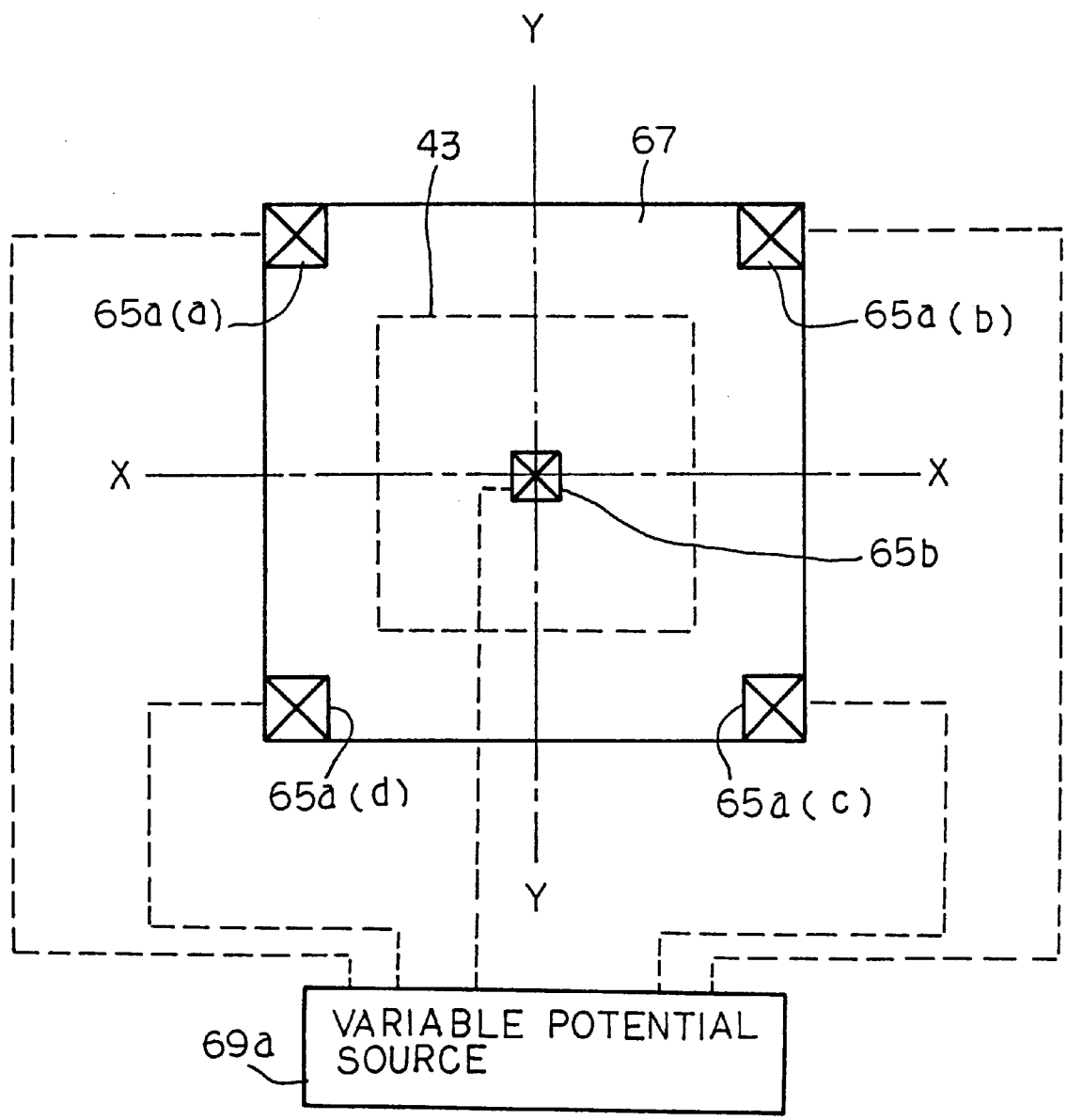
FIG. 16 is a bottom view showing the rectangular resilient plate member and the actuator elements shown in FIGS. 12 and 13.

FIG. 16 illustrates the rectangular resilient plate member 67 associated with the actuator elements 65a/65b. In this instance, electric potential is independently applied not only between the actuator elements 65a and the actuator element 65b but also between the actuator elements 65a. In the following description, the actuator elements 65a are suffixed with (a), (b), (c) and (d) in order to designate the location thereof When the rectangular resilient plate member 67 declines with respect to Y-Y axis, the actuator elements 65a(a) and 65a(b) are paired with the actuator elements 65a(d) and 65a(c), respectively. One of the pairs of the actuator elements 65a(a)/65a(d) or 65a(b)/65a(c) is expanded, and the other pair is shrunk. On the other hand, when the rectangular resilient plate member 67 declines with respect to X-X axis, the actuator elements 65a(a) and 65a(d) are paired with the actuator elements 65a(b) and 65a(c), respectively. One of the pairs of the actuator elements 65a(a)/65a(b) or 65a(d)/65a(c) is expanded, and the other pair is shrunk. In this way, the driving mechanism for rotation may be implemented by a variable potential source 69a. Of course, the manufacturer takes the deformation of the rectangular resilient plate member into account in order to determine the output potential levels of the variable potential source 69a.

Second Embodiment

Figure 17:
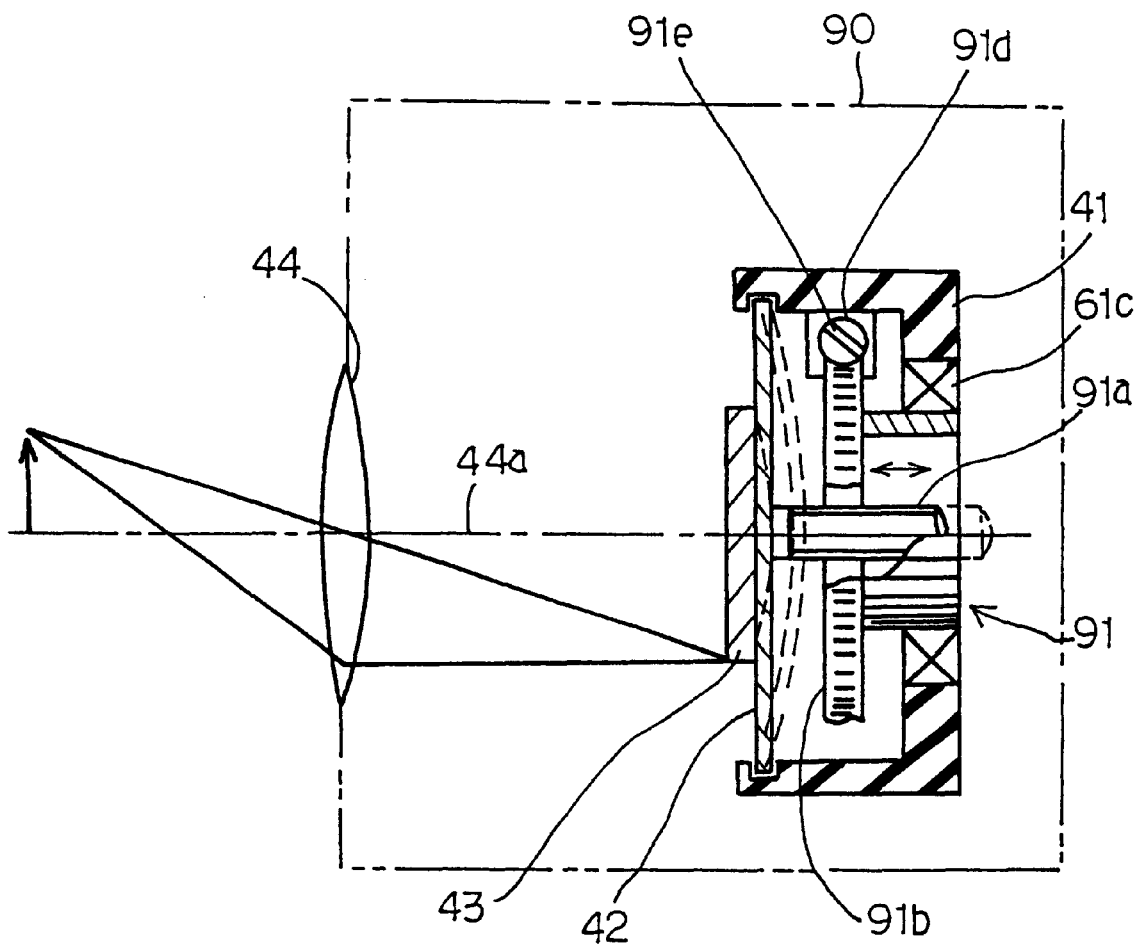
FIG. 17 is a schematic cross sectional view showing the structure of another video recorder embodying the present invention.

FIG. 17 illustrates another video recorder 90 embodying the present invention. The video recorder 90 is similar to the video recorder 40 except for an actuator 91. For this reason, the other component parts are labeled with the same references designating corresponding parts of the video recorder 40.

The actuator 91 mechanically warps the resilient plate member 42, and includes a threaded rod member 90a fixed to the center area of the resilient plate member 42, a worm wheel 91b engaged with the threaded rod member 91a and supported by a bearing 91c attached to the retainer 41 and a worm 91d engaged with the worm wheel 91b. The worm 91d is rotatably supported by the retainer 41, and a groove 91e is formed in the end surface of the worm 91d. User inserts a suitable tool such as a screwdriver (not shown) into the groove 91e, and rotates the worm 91d in either direction. The worm is rotated, and the worm wheel 91b is driven for rotation around the center axis thereof aligned with the optical axis 44a. Then, the threaded rod member 91a is moved along the optical axis 44a. The threaded rod member 91a pushes or pulls the resilient plate member 42, and warps the resilient plate member 42 as similar to that of the first embodiment.

Figure 18:
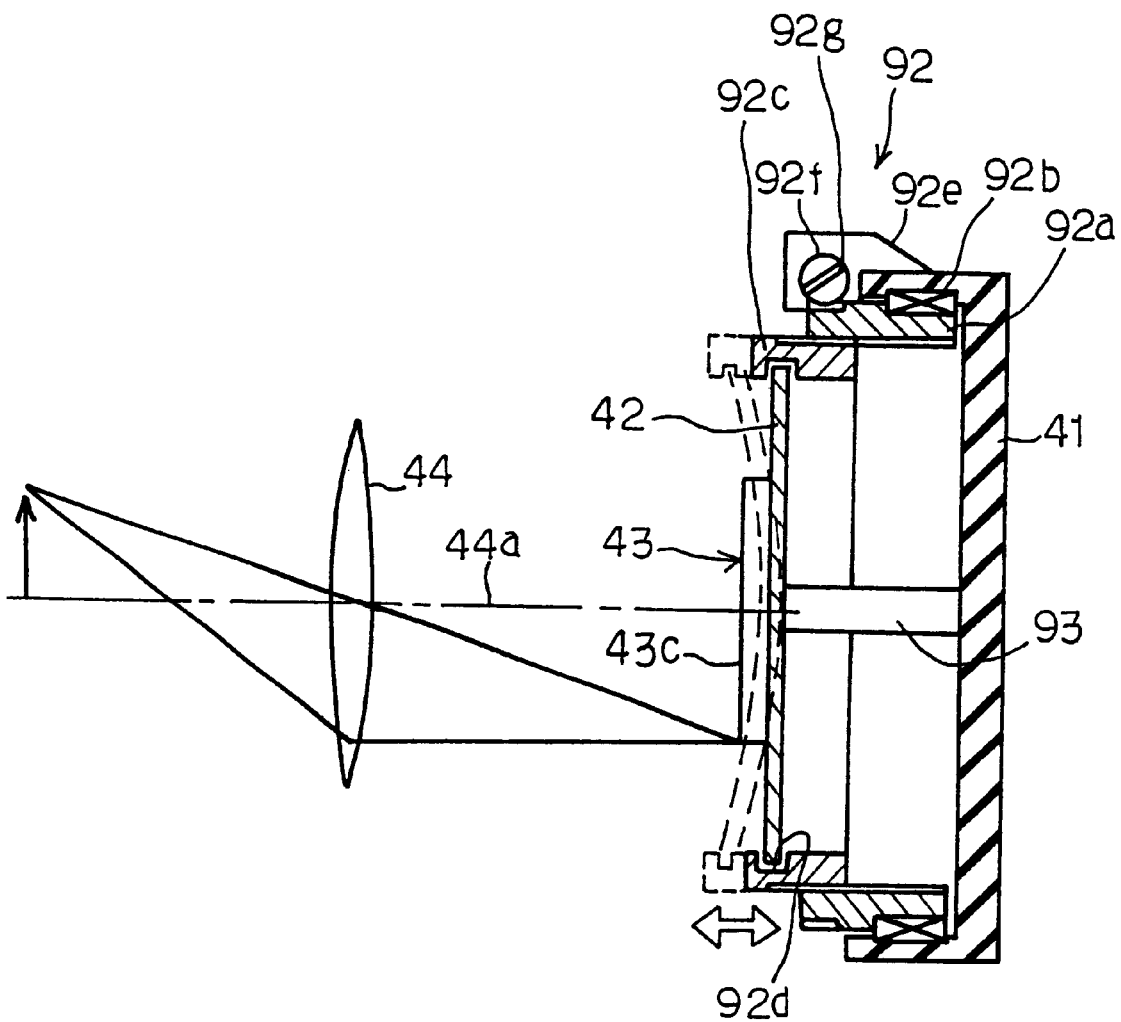
FIG. 18 is a schematic cross sectional view showing a modification of the video recorder shown in FIG. 17.

FIG. 18 illustrates another mechanical actuator 92. The resilient plate member 42 is supported at the center area thereof by a rigid post member 93. The mechanical actuator 92 includes a ring-shaped worm wheel 92a rotatably supported by the retainer 41 by means of a bearing 92b, and the inner surface of the worm wheel 92a is threaded. The mechanical actuator 92 further includes a movable ring 92c, and the outer surface of the movable ring 92c is also threaded. The threaded inner surface is meshed with the outer surface. A groove 92d is formed in the movable ring 92c, and the periphery of the resilient plate member 42 is inserted into the groove 92d. The mechanical actuator 92 further comprises a bracket 92e fixed to the retainer 41 and a worm 92f rotatably supported by the bracket 92e. The worm 92f is engaged with the worm wheel 92a, and a groove 92g is formed in the end surface of the worm 92f.

While the worm 92f is rotating, the worm wheel 92a is driven for rotation, and the movable ring 92c is moved in the direction of optical axis 44a. As a result, the resilient plate member 42 is deformed as indicated by broken lines.

The mechanical actuators 91 and 92 do not consume electric power, and maintain the resilient plate member 43 at the position when the built-in battery comes to the end. The worm 91d/92f and the worm wheel 91b/92c achieve a large reduction ratio, and user can exactly adjust the surface 43c to the focal plane. If the lead angle of the worm is appropriately designed, the worm 91d/92f and the worm wheel 91b/92c serve as an automatic diaphragm. When the worm 91d/92f and the worm wheel 91b/92c adjust the surface 43c to the focal plane, the adjustment is maintained.

As will be appreciated from the foregoing description, the actuator deforms the resilient plate member and the semiconductor chip in such a manner as to match the surface of the semiconductor chip with the focal plane. As a result, the charge-coupled device takes an image at high resolution without an expensive lens.

Moreover, user can intentionally decrease the resolution for a vignette. It is possible to replace a focusing mechanism with the actuator according to the present invention.

When the semiconductor chip is deformed to be concave, the incident angle to the micro-lens becomes small, and the reflection on the photo-shield plate is decreased. As a result, an image is clearly picked up in the peripheral area of the photo-electric converting region.

Although particular embodiments of the present invention have been shown and described, it will be obvious to those skilled in the art that various changes and modifications may be made without departing from the spirit and scope of the present invention.

For example, the rectangular resilient plate member 62 may be replaced with any kind of polygonal resilient plate member, and the actuator elements 60a may not be limited to four.

The worm 91d/92f may be driven for rotation through a suitable transmission mechanism by user. The transmission mechanism may be linked with a suitable optical system so that the user optically checks the alignment between the surface 43c and the focal plane.

In the above described embodiments, the surface 43c of the semiconductor chip 43 is deformed to be as close to a part of spherical surface as possible. However, the surface 43c may be deformed to be a part of non-spherical surface depending upon the optical characteristics of the lens 44.

What is claimed is:

1. A solid state image pick-up device comprising
a retainer having a hollow space open to one end thereof,
a resilient plate member provided in said hollow space,
a semiconductor chip having an integrated circuit containing a charge coupled device and fixed to said resilient plate member so as to be conformable to said resilient plate member,
a lens spaced from said semiconductor chip so as to focus an optical image onto a portion of said semiconductor chip where said charge coupled device is fabricated, and
an actuator connected between said retainer and said resilient plate member so as to deform said resilient plate member.

2. The solid state image pick-up device as set forth in claim 1, in which said actuator is implemented by an electrostrictive element expandable and shrinkable under application of electric potential.

3. The solid state image pick-up device as set forth in claim 2, in which said resilient plate member has a peripheral portion restricted by said retainer-, and said electrostrictive element is connected between said retainer and a central area of said resilient plate member where an optical axis passes.

4. The solid state image pick-up device as set forth in claim 3, in which said peripheral portion is thicker than a central portion of said resilient plate member.

5. The solid state image pick-up device as set forth in claim 3, in which a plurality of cocentrical grooves are formed in said resilient plate member.

6. The solid state image pick-up device as set forth in claim 2, in which a rigid post member is connected between said retainer and a central area of said resilient plate member where an optical axis passes, and said electrostrictive element is divided into a plurality of sub-elements connected between said retainer and a peripheral area of said resilient plate member.

7. The solid state image pick-up device as set forth in claim 6, in which said sub-elements are concurrently expanded or shrunk.

8. The solid state image pick-up device as set forth in claim 2, wherein said electrostrictive element is coupled to the resilient plate member at a central portion, and wherein the device further comprises a plurality of peripheral electrostrictive elements, said plurality of peripheral electrostrictive sub-elements comprising a first group and a second groups said first group and said second group being connected between said retainer and a peripheral area of said resilient plate member, one of said first and second groups being expandable, and the other of said first and second groups being contractible so that said resilient plate member is declined with respect to said optical axis.

9. The solid state image pick-up device as set forth in claim 1, in which said actuator is implemented by a reciprocating mechanism.

10. The solid state image pick-up device as set forth in claim 9, in which said resilient plate member has a peripheral portion restricted by said retainer, and said reciprocating mechanism includes a worm rotatably Supported by said retainer, a worm wheel rotatably supported by said retainer and engaged with said worm and a threaded rod member connected to a central area of said resilient plate member and held in threaded engagement with a threaded portion of said worm wheel.

11. The solid state image pick-up device as set forth in claim 9, in which said resilient plate member has a peripheral portion restricted by a movable ring movable in a direction of an optical axis with respect to said retainer, a rigid post member connected between said retainer and a central area of said resilient plate member where said optical axis passes, a worm rotatably supported by said retainer and a worm wheel rotatably supported by said retainer, engaged with s aid worm and having an inner threaded portion engaged with an outer threaded portion of said movable worm.

12. The solid state image pick-up device as set forth in claim 1, further comprising a driving mechanism connected to said retainer for changing a relative relation between said retainer and an optical axis passing through said lens.

13. The solid state image pick-up device as set forth in claim 12, in which said driving mechanism offsets a center line of said semi conductor chip from said optical axis.

14. The solid state image pick-p device as set forth in claim 12, in which said driving mechanism makes said semiconductor chip decline from a virtual plane perpendicular to said optical axis.

* * * * *